United States Patent
Moreaux et al.

(10) Patent No.: US 7,675,341 B2
(45) Date of Patent: Mar. 9, 2010

(54) METHOD AND DEVICE FOR GENERATING A CLOCK SIGNAL

(75) Inventors: Christophe Moreaux, Simiane (FR); Ahmed Kari, Aix en Provence (FR); David Naura, Aix en Provence (FR); Pierre Rizzo, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 3 days.

(21) Appl. No.: 12/041,449

(22) Filed: Mar. 3, 2008

(65) Prior Publication Data

US 2008/0211562 A1 Sep. 4, 2008

Related U.S. Application Data

(63) Continuation-in-part of application No. PCT/FR2006/001778, filed on Jul. 20, 2006.

(30) Foreign Application Priority Data

Sep. 6, 2005 (FR) .................................. 05 09082

(51) Int. Cl.
*H03K 3/00* (2006.01)

(52) U.S. Cl. .................................... 327/299; 327/141
(58) Field of Classification Search ................. 327/291, 327/292, 293, 294, 298, 299, 141
See application file for complete search history.

(56) References Cited

U.S. PATENT DOCUMENTS 5,828,248 A * 10/1998 Masuda ...................... 327/113
6,768,511 B1 * 7/2004 Nakai et al. ............... 348/229.1

FOREIGN PATENT DOCUMENTS

WO    02/065380 A2    8/2002

* cited by examiner

*Primary Examiner*—Lincoln Donovan
*Assistant Examiner*—Sibin Chen
(74) *Attorney, Agent, or Firm*—Lisa K. Jorgenson; E. Russell Tarleton; Seed IP Law Group PLLC

(57) ABSTRACT

A method and device for generating a clock signal, the method including measuring, using a first clock signal, a characteristic of a reference event in a received signal, determining, using the first clock signal, a variation of a characteristic of a second event in a received signal, correcting the measurement according to the variation of the characteristic of the second event, and generating a second clock signal using the first clock signal according to the corrected measurement.

25 Claims, 3 Drawing Sheets

METHOD AND DEVICE FOR GENERATING A CLOCK SIGNAL

BACKGROUND OF THE INVENTION

1. Field of the Invention

The present invention relates to the generation of a clock signal in an integrated circuit and, more particularly but not exclusively, to contactless tags, such as Radio-Frequency Identification tags (RFID).

2. Description of the Related Art

RFID tags generally comprise send and receive circuits for sending and receiving modulated radioelectric signals to exchange data with a reader, an electrical supply circuit to generate a supply voltage of the integrated circuit using the electromagnetic field generated by the reader, a processing unit, and a non-volatile memory, of EEPROM-type for example.

The send and receive circuits of the tag use a clock signal, the frequency of which must vary as little as possible to be able to decode the data received and to send signals capable of being decoded by a receive unit of a reader.

Furthermore, this clock signal must be synchronized with that of the reader. For this purpose, the reader sends the tag a reference signal, which the tag uses to adjust the frequency of its clock signal. To generate a clock signal having a constant frequency, a local oscillator is generally used that produces a reference frequency signal from which the clock signal is generated.

However, it is difficult to produce such a reference frequency in an integrated circuit such as a contactless tag. Indeed, oscillators are sensitive to their environment and to temperature variations in particular. Furthermore, a contactless tag can be subjected to very variable environments. Moreover, the internal temperature of a tag can vary significantly during a communication session with a reader. The result is that the reference frequency generated by the local oscillator can also vary during a communication session.

Furthermore, the reference signal enabling the tag to determine its clock frequency is generally only transmitted once, at the start of a communication session with a reader. The result is that the tag cannot re-adjust its clock frequency several times during a session.

BRIEF SUMMARY OF THE INVENTION

The disclosed embodiments of the present invention are directed to regulating a clock frequency on the basis of a signal received and to provide a method for generating a clock signal that includes the steps of:

taking, by using a first clock signal, a first measurement of a characteristic of a reference event in a received signal, and generating a second clock signal using the first clock signal according to the first measurement.

According to a method of the present invention, the method includes the steps of:

determining, using the first clock signal, a variation of a characteristic of at least a second event in a received signal, the second event being distinct from the reference event, and correcting the first measurement according to the variation of the characteristic of the second event, the second clock signal being generated according to the corrected first measurement.

According to one embodiment of the present invention, the method includes the steps of:

taking a second measurement of a characteristic of a first occurrence of the second event in the received signal, taking a third measurement of the characteristic of a new occurrence of the second event in the received signal, the second and third measurements being taken using the first clock signal, comparing the third measurement with the second measurement, and correcting the first measurement according to the result of the comparison.

According to another embodiment of the present invention, the characteristic of each new occurrence of the second event in the received signal is measured and the measurement is compared with the second measurement, the first measurement being corrected according to the result of the comparison.

According to one embodiment of the present invention, each event in the received signal is a pulse including two edges, and the measurements are taken by counting the number of pulses of the first clock signal between the two edges.

According to one embodiment of the present invention, the second clock signal is generated by dividing the frequency of the first clock signal by the first measurement.

According to one embodiment of the present invention, the first measurement is first divided by a constant number before being used to generate the second clock signal.

According to one embodiment of the present invention, the first measurement is corrected if the variation of the characteristic of the second event exceeds a certain threshold value.

According to one embodiment of the present invention, the first measurement is corrected by incrementing or decrementing the first measurement by a fixed value depending on whether the variation of the characteristic of the second event is increasing or decreasing.

The disclosed embodiments of the present invention also relate to a device for generating a clock signal, the device including:

a measuring circuit adapted to take a first measurement of a characteristic of a reference event in a received signal, using a first clock signal, and a generation circuit adapted to generate a second clock signal using the first clock signal according to the first measurement.

According to the present invention, the device also includes:

a circuit adapted to determine a variation of a characteristic of at least a second event in a received signal, using the first clock signal, the second event being distinct from the reference event, a correction circuit adapted to correct the first measurement according to the variation of the characteristic of the second event, the second clock signal being generated according to the corrected first measurement.

According to one embodiment of the present invention, the measuring circuit takes a second measurement of the characteristic of a first occurrence of the second event in the received signal, and a third measurement of the characteristic of a new occurrence of the second event in the received signal, the device including a comparison circuit for comparing the third measurement with the second measurement, the correction circuit correcting the first measurement according to the result of the comparison.

According to one embodiment of the present invention, the measuring circuit takes a measurement of the characteristic of each new occurrence of the second event in the received signal, the comparison circuit compares each new measurement with the second measurement, and the correction means correct the first measurement upon each comparison.

According to one embodiment of the present invention, the generation circuit for generating the second clock signal divides the frequency of the first clock signal by the first measurement.

According to one embodiment of the present invention, the generation circuit for generating the second clock signal first divides the first measurement by a constant number, the result of the division being used to generate the second clock signal.

According to one embodiment of the present invention, the correction circuit applies a correction to the first measurement if the variation of the characteristic of the second event exceeds a certain threshold value.

According to one embodiment of the present invention, the correction circuit applies a correction to the first measurement by incrementing or decrementing the first measurement by a fixed value depending on whether the variation of the characteristic of the second event is increasing or decreasing.

The present invention also relates to an integrated circuit that includes a device as defined above.

According to one embodiment of the present invention, the integrated circuit includes send and receive circuits for sending and receiving modulated radioelectric signals, an electric power supply circuit for generating a supply voltage of the integrated circuit using radioelectric signals received, a processing unit and a non-volatile memory.

In accordance with another embodiment of the invention, a clock generation circuit for generating a local clock signal in response to a received signal is provided. This circuit includes an oscillator adapted to generate a first clock signal; a first counter coupled to the oscillator to receive the first clock signal and to receive the received signal and to generate an output signal; a state machine circuit coupled to the first counter and adapted to generate a state machine clock signal responsive to the first clock signal; and a second counter coupled to the oscillator and to the state machine circuit and generating a second clock signal responsive to the first clock signal and to the state machine clock signal, the second clock signal comprising the local clock signal of the clock generation circuit.

In accordance with another aspect of the foregoing embodiment, the value of the first counter is proportional to a duration of a pulse of the received signal. In other words, the first counter is adapted to count pulses of the received signal between a rising edge and a falling edge of the received signal.

In accordance with another aspect of the foregoing embodiment, the state machine is configured to store in an output register the state machine clock signal, and the second counter is configured to count pulses of the first clock signal and to generate the second clock signal that comprises one pulse when the second counter reaches a value equal to a value of the state machine clock signal stored in the output register.

In accordance with another aspect of the foregoing embodiment, the state machine circuit is adapted to respond to a first event in the received signal that is received by the first counter by loading a value of the first counter in the state machine circuit.

In accordance with yet a further aspect of the foregoing embodiment, a correction circuit is provided that has a first comparator circuit configured to compare values of the first counter upon receipt of first and second occurrences of a second event in the received signal and to generate a first correction signal to a state machine register when a difference in the compared values of the first counter is detected. Ideally, the correction circuit also includes a second comparator circuit configured to compare values of the first counter circuit in response to occurrences of a third event in the received signal and to generate a second correction signal to correct the value of the state machine clock signal stored in the state machine register when differences in the compared values of the first counter are detected by the second comparator.

BRIEF DESCRIPTION OF THE SEVERAL VIEWS OF THE DRAWING(S)

The foregoing and other features and advantages of the disclosed embodiments of the present invention will be presented in greater detail in the following description of an embodiment of the present invention, given in relation with, but not limited to the following figures, in which.

DETAILED DESCRIPTION OF THE INVENTION

Figure 1:
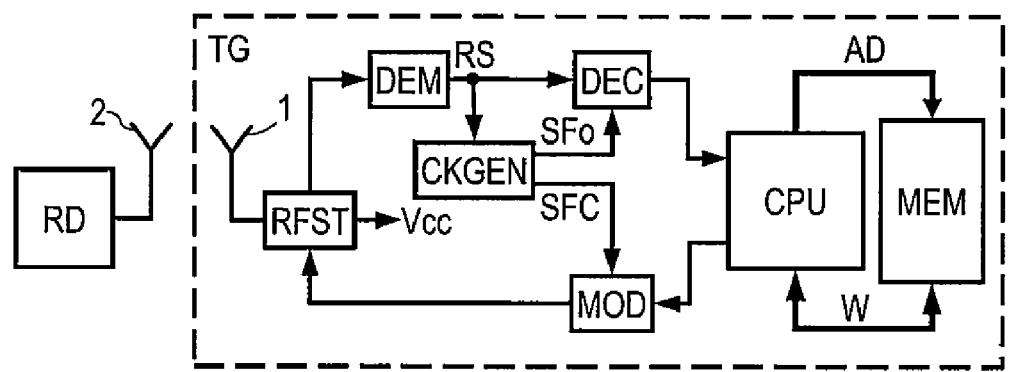
FIG. 1 represents the architecture of a contactless tag in block form.

FIG. 1 represents an integrated circuit TG such as a contactless tag, comprising a processing unit CPU coupled to a memory MEM. The processing unit communicates with an external reader RD coupled to an antenna 2, using an antenna 1 connected to a radio-frequency stage RFST. The stage RFST is connected to a demodulator DEM and to a modulator MOD. The demodulator is connected to a decoder DEC that supplies the processing unit CPU with data received and demodulated. The modulator modulates data supplied by the processing unit and applies the modulated data to the stage RFST with a view to the data being sent to the reader RD. The processing unit CPU is connected to the memory MEM by address and data buses, enabling the transmission of an address AD to be accessed and of a word W to be stored or which is read in the memory at the address AD.

Furthermore, the stage RFST produces a direct voltage Vcc to supply the integrated circuit TG, using an electric or electromagnetic field radiated by the reader RD. The integrated circuit also comprises a clock signal generating circuit CKGEN supplying a first clock signal SFo to the decoder DEC and a second clock signal SFC to the modulator MOD.

Data transmission between the integrated circuit TG and the reader RD is for example performed using ASK (Amplitude Shift Keying) or PSK (Phase Shift Keying) modulation. The demodulator DEM supplies the decoder with a signal RS the shape of which corresponds to the envelope of the signal received. The decoder samples this signal using the first clock signal SFo to obtain a binary signal containing the data received.

Figure 2:
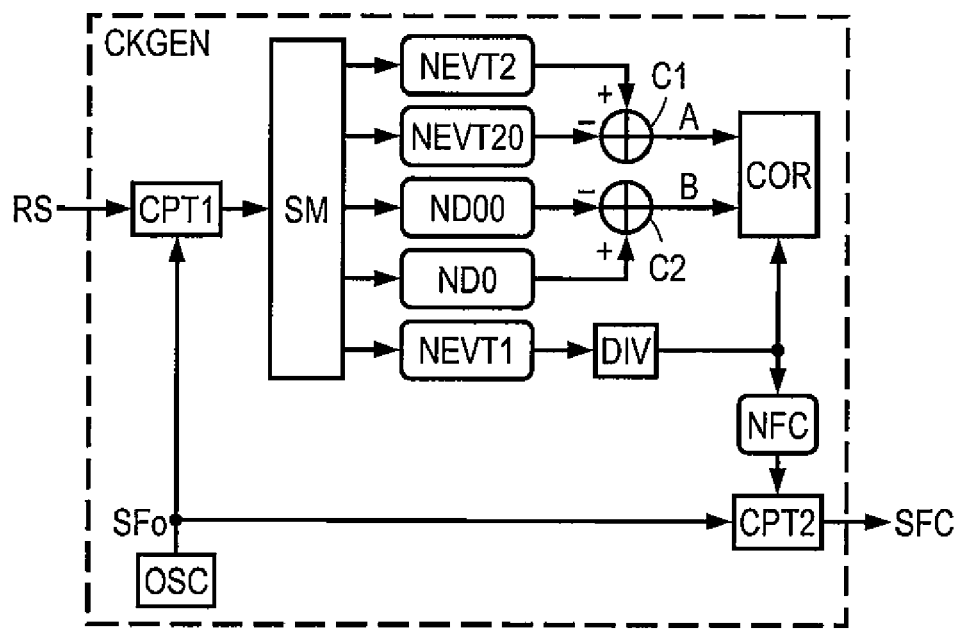
FIG. 2 represents in block form a clock signal generating circuit according to the present invention.

FIG. 2 represents the clock signal generating circuit CKGEN. This circuit comprises a local oscillator OSC and a first counter CPT1. The oscillator generates the first clock signal SFo of frequency Fo. The counter CPT1 receives the clock signal SFo and the signal RS coming from the demodulator DEM. The output of the counter is connected to the input of a state machine SM that distributes the value of the counter in several registers, including a register NEVT1. The register NEVT1 is connected to the input of a divider DIV the output of which is connected to a register NFC.

The circuit CKGEN comprises a second counter CPT2 receiving the clock signal SFo and controlled by the value contained in the register NFC. The output of the counter CPT2 supplies the clock signal SFC at output of the circuit CKGEN.

The first counter CPT1 counts the pulses of the signal SFo between a rising edge and a falling edge of the signal RS. For this purpose, it is initialized and triggered upon each rising edge of the signal RS, and stopped upon each falling edge of this signal. The value of the counter is therefore proportional to the duration of a pulse of the signal RS.

The state machine SM loads the registers to which it is connected with the value of the counter CPT1 according to an expected order of the different events in the frames received, each event corresponding to one pulse.

Following the appearance of a reference event EVT1 in the received signal RS, the value of the counter CPT1 is loaded by the state machine SM in the register NEVT1. The divider DIV divides the value contained in this register by a constant factor R. The result of the division is stored in the register NFC. The counter CPT2 counts the pulses of the clock signal SFo, and generates at output the clock signal SFC that comprises one pulse every time the counter has reached the value contained in the register NFC.

The reference event EVT1 generally consists of a pulse having a predefined duration, which is transmitted solely in a first frame of a communication session between a reader RD and the integrated circuit TG. The reference event is provided to enable the integrated circuit TG to generate a clock frequency FC having a value required by the reader RD to exchange data with the latter. It is not therefore possible to use new occurrences of the reference event in the signal received by the integrated circuit to re-adjust the clock frequency FC, in the event of a drift in the frequency Fo of the local oscillator OSC.

According to the present invention, the circuit CKGEN comprises two additional registers NEVT2 and NEVT20 connected to the state machine SM and to the inputs of a comparator C1. The output of the comparator is connected to an input of a correction circuit COR applying a correction to the value of the register NFC according to the result of the comparison.

The two registers NEVT2 and NEVT20 receive the value of the counter CPT1 from the state machine SM when a second event EVT2 distinct from the first event appears in the received signal RS. The register NEVT20 receives the value of the counter CPT1 when a first occurrence of the second event appears in the received signal, while the register NEVT2 receives the value of the counter CPT1 when new occurrences of the second event appear in the received signal.

The comparator C1 supplies the correction circuit COR with the difference between the values contained in the two registers NEVT2 and NEVT20. This difference is representative of a variation in the measurement of the duration of the second event. This duration is defined by the reader RD and is thus taken to be constant. As a result, a variation in this measurement reveals a variation in the frequency Fo of the oscillator.

As a result of these provisions, the frequency FC of the clock signal SFC is adjusted several times during a communication session of the integrated circuit TG with a reader RD, even if the reference event EVT1 used to determine the clock frequency FC is only transmitted once.

It should be noted that the higher the values stored in the registers, i.e., the longer the measured events last, the better the precision of the correction is.

In one embodiment of the correction circuit COR, the latter applies a correction to the value of the register NFC when the value received from the comparator exceeds a certain threshold. The correction applied by the circuit COR can involve incrementing or decrementing the value of the register by a fixed value depending on whether the value supplied by the comparator C1 is positive or negative. In other words, the register NFC is incremented or decremented depending on whether the variation in the characteristic of the second event EVT2 is increasing or decreasing. In this case, the correction circuit transfers the content of the register NEVT2 into the register NEVT20 when it applies a correction to the content of the register NFC.

According to one embodiment of the present invention, the circuit CKGEN comprises two other additional registers ND0 and ND00 connected to the state machine and to the inputs of a comparator C2. The output of the comparator C2 is connected to an input of the correction circuit COR. The two registers ND0 and ND00 receive the value of the counter CPT1 from the state machine SM when a third event distinct from the first two events appears in the received signal RS. The register ND00 receives the value of the counter CPT1 when a first occurrence of the third event appears in the received signal, while the register ND0 receives the value of the counter CPT1 when new occurrences of the third event appear in the received signal. The correction circuit COR uses the output of the comparator C2 in a similar manner to the output of the comparator C1 to correct the value stored in the register NFC.

This arrangement enables the frequency FC of the clock signal SFC to be adjusted even more frequently. It further enables a better adjustment precision to be obtained if one of the second and third events has a low frequency of appearance in the received signal, and if the duration of the other event is insufficient to obtain a good precision.

Figure 3A:
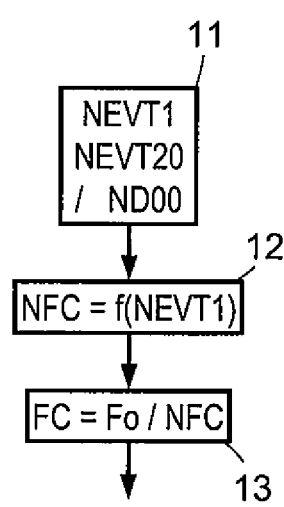
FIGS. 3A and 3B are flowcharts of procedures of adjusting the frequency of a clock signal, according to the present invention.
Figure 3B:
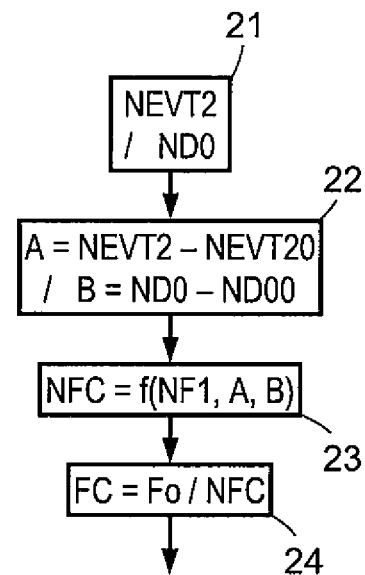

FIGS. 3A and 3B show the operation of the clock generating circuit CKGEN in the form of flowcharts. The flowchart in FIG. 3A represents a procedure that is executed when the integrated circuit TG receives the first frame of a communication session between a reader and an integrated circuit. This procedure comprises the following successive steps:

step 11: appearance of the events EVT1, EVT2 and D0 and loading the duration of these events into the registers NEVT1, NEVT20 and ND00, step 12: calculating the value contained in the register NFC according to the duration NEVT1 of the event EVT1, and step 13: generating the clock signal SFC at the frequency FC according to the content of the register NFC.

The flowchart in FIG. 3B represents a procedure that is executed upon receipt of the second frame and of each of the following frames, transmitted by the reader RD to the integrated circuit TG during the session. This procedure comprises the following successive steps:

step 21: appearance of the events EVT2 and D0 and loading the duration of these events into the registers NEVT2 and N0, step 22: calculating the difference A between the values contained in the registers NEVT2 and NEVT20, and the difference B between the values contained in the registers ND0 and ND00, step 23: calculating a new value of the register NFC according to the previous value of the register NFC and the differences A and B, and step 24: generating the clock signal SFC at the frequency FC according to the content of the register NFC.

Figure 4A:
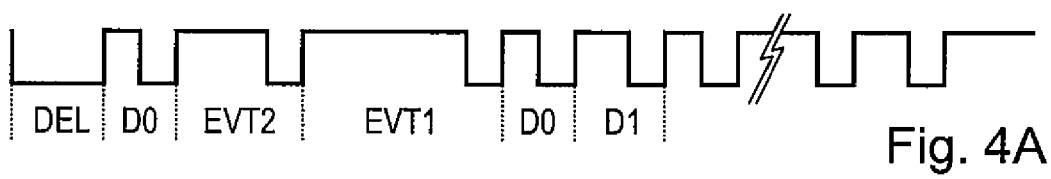
FIGS. 4A and 4B represent in the form of timing diagrams the shape of signals transmitted to a contactless tag.
Figure 4B:
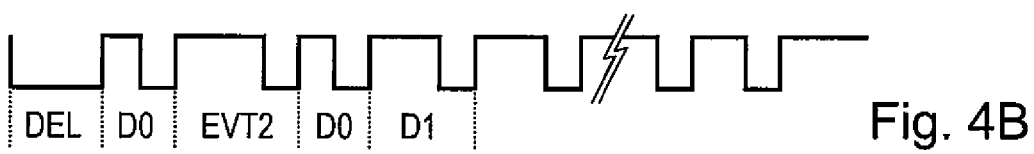

FIGS. 4A and 4B represent the form of a first frame and of the following frames transmitted by a reader RD to the integrated circuit TG during a session. The first frame received by the integrated circuit comprises a header-block successively comprising:

a delimitation sequence DEL, a first pulse corresponding to the third event D0 and consisting of a bit on 0, a second pulse corresponding to the second event EVT2, and a third pulse corresponding to the first event EVT1.

The following pulses correspond to the bits D0 on 0 and D1 on 1 of the data transmitted in the frame.

The following frames represented in FIG. 4B comprise a header-block comprising the same pulses as the first frame, except for the pulse corresponding to the first event EVT1.

It can be seen that the pulse having the longest duration is the one corresponding to the first event EVT1 that is used to determine the clock frequency FC of the output signal SFC of the circuit CKGEN. In addition, the pulse corresponding to the third event D0 used to adjust the frequency FC appears the most frequently in the frames, but has the shortest duration out of the three events.

The state machine SM distributes the successive values of the counter CPT1 in the registers NEVT1, NEVT20, NEVT2, ND00 and ND0 according to the order of appearance of the corresponding events in the frames received during a session. The registers NEVT1, NEVT20 and ND00 are filled upon the first frame received during a session, while the registers NEVT2 and ND0 are updated upon each next frame received during the session. The state machine can also detect the bits on 0 in the data received and load the value of the counter CPT1 into the register ND0.

Figure 5A:
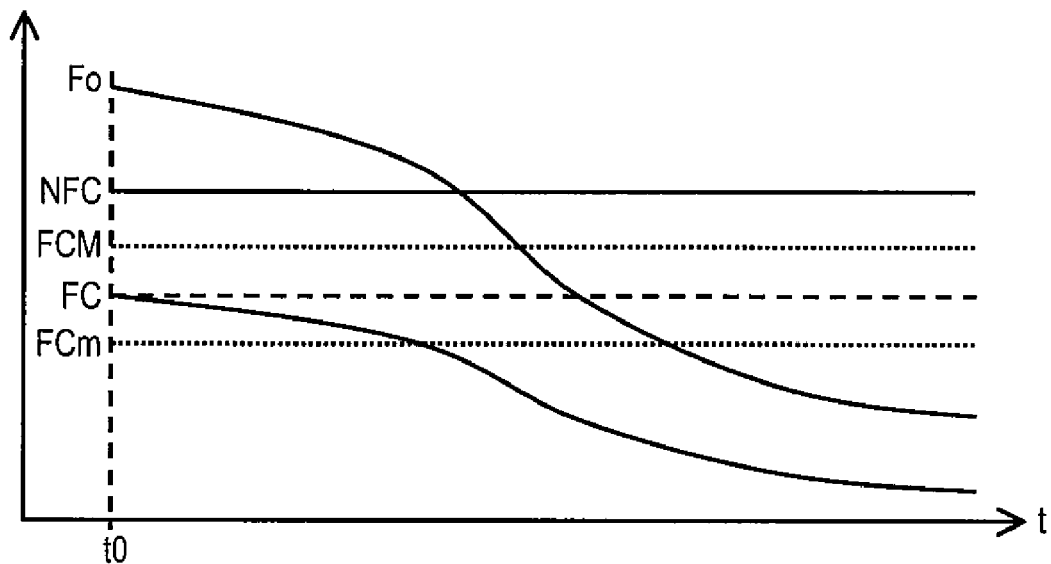
FIG. 5A represents variation curves of certain signals in a clock generating circuit that does not comprise any regulation device.
Figure 5B:
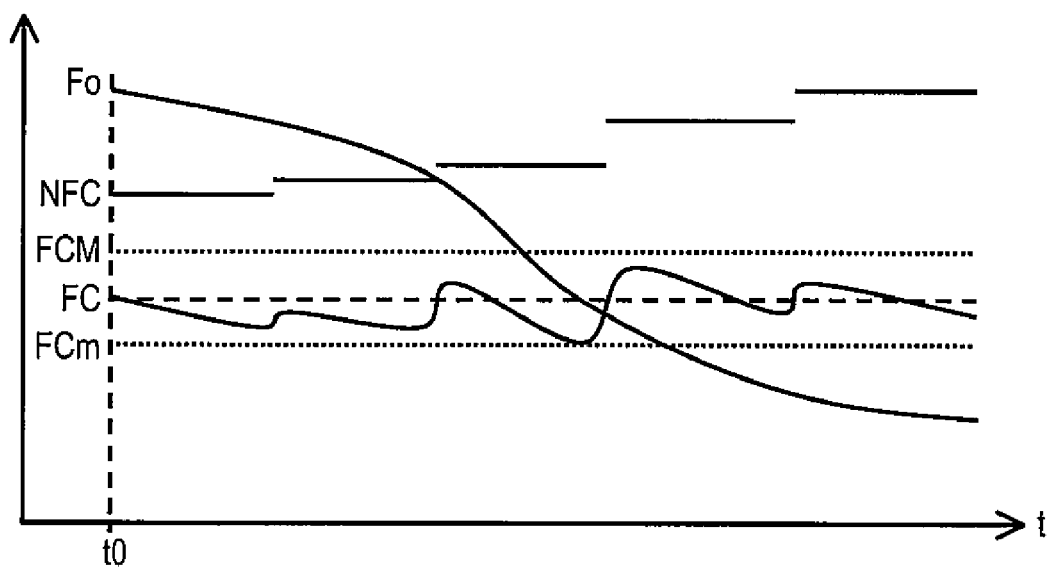
FIG. 5B represents variation curves of certain signals in the clock generating circuit shown in FIG. 2.

FIGS. 5A and 5B represent variation curves, starting from the instant t0 of receiving a first frame, of the following information:

the frequency Fo of the signal generated by the oscillator OSC, the content of the register NFC, and the output frequency FC of the circuit CKGEN.

FIG. 5A shows that if the frequency Fo is not constant, while the content of the register NFC remains constant, the frequency FC substantially follows the variations in the frequency Fo, and leaves a tolerance zone delimited by high FCM and low FCm frequencies.

FIG. 5B shows the same signals as FIG. 5A, when the content of the register NFC is corrected by the correction circuit COR according to the drift in the frequency Fo determined by measuring the variation in the duration of the events EVT2 and/or D0. This figure shows that if such a correction is performed, the frequency FC remains within the tolerance zone FCm-FCM.

The decoding performed by the decoder DEC involves counting the time between 2 edges through the counter CPT1 paced by the first clock signal SFo. The number obtained is compared with NEVT2/2. The result of the comparison indicates whether it is a datum on 0 (<NEVT2/2) or a datum on 1 (>NEVT2/2).

It will be understood by those skilled in the art that various alternatives of the method according to the present invention are possible. Thus, the present invention is not limited to adjusting a clock frequency according to pulse duration measurements. It is possible to consider measuring any other characteristic, such as a number of pulses between two specific events for example. Moreover, the pulse durations can be measured between two successive edges in the same or opposite direction (between two successive falling edges or rising edges).

It is not necessary either for the measurement of the first event and the first measurement of the second event to be taken at the same time (consecutively in the same frame). Generally speaking, it is not necessary for the events measured to appear in the same signal.

It is also possible to consider correcting the first measurement NEVT1 indifferently before or after the division performed by the divider DIV. The correction applied to the first measurement can involve determining this measurement without taking the previous value of this measurement into account.

The present invention does not necessarily apply to contactless tags. It applies more generally to any system comprising send or receive circuits or both using a clock frequency determined using the received signal.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for generating and correcting a clock signal in a passive communication device, comprising the steps of:

generating a direct voltage from a received radio frequency signal;

generating a first clock signal using the direct voltage;

taking, using the first clock signal, a first measurement of a characteristic of a reference event detected in the received signal;

generating a second clock signal using the first clock signal according to the first measurement;

determining, using the first clock signal, a variation of a characteristic of at least a second event in the received signal that is distinct from the reference event; and correcting the first measurement according to the variation of the characteristic of the second event, and correcting the second clock signal according to the corrected first measurement.

2. The method of claim 1, comprising the steps of:

taking a second measurement of a characteristic of a first occurrence of the second event in the received signal, taking a third measurement of the characteristic of a new occurrence of the second event in the received signal, the second and third measurements being taken using the first clock signal, comparing the third measurement with the second measurement, and correcting the first measurement according to the result of the comparison.

3. The method of claim 2, wherein the characteristic of each new occurrence of the second event in the received signal is measured and the measurement is compared with the second measurement, the first measurement being corrected according to the result of the comparison.

4. The method of claim 1, wherein each event in the received signal is a pulse comprising two edges, and the measurements are taken by counting the number of pulses of the first clock signal between the two edges.

5. The method of claim 1, wherein the second clock signal is generated by dividing the frequency of the first clock signal by the first measurement.

6. The method of claim 1, wherein the first measurement is first divided by a constant number before being used to generate the second clock signal.

7. The method of claim 1, wherein the first measurement is corrected if the variation of the characteristic of the second event exceeds a certain threshold value.

8. The method of claim 1, wherein the first measurement is corrected by incrementing or decrementing the first measurement by a fixed value depending on whether the variation of the characteristic of the second event is increasing or decreasing.

9. A device for generating and correcting a clock signal in a passive communication device, comprising:
a direct voltage generator that generates a direct voltage in response to a received signal;
a first clock circuit that generates a first clock signal using the direct voltage;
a measurement circuit structured to take a first measurement of a characteristic of a reference event in the received signal, using the first clock signal;
a second clock circuit that generates a second clock signal using the first clock signal according to the first measurement;
a comparison circuit structured to determine a variation of a characteristic of at least a second event in the received signal, using the first clock signal, the second event being distinct from the reference event; and
a correction circuit that corrects the first measurement according to the variation of the characteristic of the second event, the second clock signal being corrected according to the corrected first measurement.

10. The device of claim 9, wherein the measurement circuit takes a second measurement of the characteristic of a first occurrence of the second event in the received signal, and a third measurement of the characteristic of a new occurrence of the second event in the received signal, the comparison circuit comparing the third measurement with the second measurement, and the correction circuit correcting the first measurement according to the result of the comparison.

11. The device of claim 10, wherein the measurement circuit takes a measurement of the characteristic of each new occurrence of the second event in the received signal, the comparison circuit then comparing each new measurement with the second measurement, and the correction circuit correcting the first measurement upon each comparison.

12. The device of claim 9, wherein each event in the received signal is a pulse comprising two edges, and the measurements are taken by counting the number of pulses of the first clock signal between the two edges.

13. The device of claim 9, wherein the generation means for generating the second clock signal divide the frequency of the first clock signal by the first measurement.

14. The device of claim 9, wherein the second clock circuit that generates the second clock signal first divides the first measurement by a constant number, the result of the division being used to generate the second clock signal.

15. The device of claim 9, wherein the correction circuit applies a correction to the first measurement if the variation of the characteristic of the second event exceeds a certain threshold value.

16. The device of claim 9, wherein the correction circuit applies a correction to the first measurement by incrementing or decrementing the first measurement by a fixed value depending on whether the variation of the characteristic of the second event is increasing or decreasing.

17. An integrated circuit, comprising: a device for generating and correcting a clock signal, the device comprising:
a direct voltage generator that generates a direct voltage in response to a received signal;
a first clock circuit that generates a first clock signal using the direct voltage;
a measurement circuit that takes a first measurement of a characteristic of a reference event in the received signal, using a first clock signal;
a second clock circuit that generates a second clock signal using the first clock signal according to the first measurement;
a comparison circuit structured to determine a variation of a characteristic of at least a second event in the received signal, using the first clock signal, the second event being distinct from the reference event; and
a correction circuit that corrects the first measurement according to the variation of the characteristic of the second event, the second clock signal being generated according to the corrected first measurement.

18. The integrated circuit of claim 17, comprising send and receive circuits for sending and receiving modulated radio-electric signals, an electric power supply circuit for generating a supply voltage of the integrated circuit using received radioelectric signals, a processing unit, and a non-volatile memory.

19. A circuit for generating a local clock signal in response to a received signal in a passive radio frequency device, the circuit comprising:
a voltage generator that generates a direct voltage in response to the received signal; and
a clock generation circuit comprising:
an oscillator adapted to receive the direct voltage and to generate a first clock signal;
a first counter coupled to the oscillator to receive the first clock signal and to receive the received signal and to generate an output signal;
a state machine circuit coupled to the first counter and adapted to generate a state machine clock signal responsive to the first clock signal and to detection of at least one event in the received signal; and
a second counter coupled to the oscillator and to the state machine circuit and generating a second clock signal responsive to the first clock signal and to the state machine clock signal, the second clock signal repeatedly corrected by the second counter in response to the detection of at least one event in the received signal.

20. The circuit of claim 19, wherein a value of the output signal of the first counter is proportional to a duration of a pulse of the received signal.

21. The circuit of claim 19, wherein the first counter is adapted to count pulses of the received signal between a rising edge and a falling edge of the received signal.

22. The circuit of claim 19, wherein the state machine circuit is configured to store in an output register the state machine clock signal, and the second counter is configured to count pulses of the first clock signal and generate the second clock signal to comprise one pulse every time the second counter has reached a value equal to a value stored in the output register of the state machine circuit.

23. The circuit of claim 22, wherein the state machine circuit is adapted to respond to a first event in the received signal as received by the first counter by loading a value of the first counter in the state machine circuit.

24. The circuit of claim 23, further comprising a correction circuit coupled to a first comparator circuit that is configured to compare values of the first counter upon receipt of first and second occurrences of a second event in the received signal, the correction circuit configured to generate a first correction signal to the state machine register when a difference in the compared values of the first counter is detected.

25. The circuit of claim 24, comprising a second comparator circuit configured to compare values of the first counter in response to occurrences of a third event in the received signal and to generate a second correction signal to correct the value of the state machine clock signal stored in the state machine register when differences in the compared values of the first counter are detected by the second comparator.

* * * * *